United States Patent

Torok et al.

Patent Number: 5,489,994
Date of Patent: Feb. 6, 1996

[54] INTEGRATED APERTURES ON A FULL FRAME CCD IMAGE SENSOR

[75] Inventors: Georgia R. Torok, Fairport; Win-Chyi Chang, Penfield, both of N.Y.

[73] Assignee: Eastman Kodak Company, Rochester, N.Y.

[21] Appl. No.: 341,253

[22] Filed: Nov. 17, 1994

Related U.S. Application Data

[63] Continuation of Ser. No. 146,840, Oct. 29, 1993, abandoned.

[51] Int. Cl.$^6$ ................................................ H04N 5/335
[52] U.S. Cl. .................................... 358/483; 348/297
[58] Field of Search .................................. 358/482, 483; 348/294, 296, 297, 309, 311, 315, 362, 367; 250/208.1; H04N 1/04, 5/335

[56] References Cited

U.S. PATENT DOCUMENTS

| | | |
|---|---|---|
| 4,204,230 | 5/1980 | Sprague . |
| 4,382,170 | 5/1983 | Tagaki et al. ............ 348/362 |
| 4,517,603 | 5/1985 | Epsztein et al. . |
| 4,543,601 | 9/1985 | Harada et al. . |
| 4,554,586 | 11/1985 | Tanuma et al. . |
| 4,581,649 | 4/1986 | Morokawa . |
| 4,589,023 | 5/1986 | Suzuki et al. ............ 348/362 |
| 4,595,954 | 6/1986 | Endo et al. . |
| 4,607,287 | 8/1986 | Endo et al. . |
| 4,608,506 | 8/1986 | Tanuma . |
| 4,612,581 | 9/1986 | Endo et al. . |
| 4,633,317 | 12/1986 | Uwira et al. . |
| 4,634,884 | 1/1987 | Hayashimoto et al. . |
| 4,638,371 | 1/1987 | Milch . |
| 4,652,928 | 3/1987 | Endo et al. . |
| 4,748,507 | 5/1988 | Gural . |
| 4,755,876 | 7/1988 | Dangler . |
| 4,826,777 | 5/1989 | Ondris .................. 250/208.1 |
| 4,910,413 | 3/1990 | Tamune . |
| 4,920,418 | 4/1990 | Robinson . |
| 4,947,239 | 8/1990 | Kondou et al. . |
| 4,947,258 | 8/1990 | Hersh . |
| 4,977,584 | 12/1990 | Kohno et al. ............ 348/296 |
| 4,992,878 | 2/1991 | Herah . |
| 4,998,164 | 3/1991 | Endo et al. . |
| 5,063,450 | 11/1991 | Pritchard . |
| 5,126,554 | 6/1992 | Ranson . |
| 5,286,990 | 2/1994 | Hynecek ................ 348/311 |
| 5,351,081 | 9/1994 | Matsui et al. ............ 348/311 |

*Primary Examiner*—Kim Yen Vu
*Attorney, Agent, or Firm*—James D. Leimbach

[57] ABSTRACT

An apparatus for capturing an image in accordance with the invention includes a full frame charge coupled device with a photosensitive layer and a mask covering a portion of said photosensitive layer with a plurality of apertures. The apparatus also includes an exposure controller for controlling the exposure of the photosensitive layer to the image to be captured and also a shifter for shifting either the image or the full frame charge coupled device to expose a different portion of the image to the photosensitive layer through the apertures. With this invention, a high resolution image can be captured with a full frame CCD image sensor, without loss of resolution. As a result, a lower cost imaging apparatus can be obtained without loss of resolution.

9 Claims, 3 Drawing Sheets

INTEGRATED APERTURES ON A FULL FRAME CCD IMAGE SENSOR

This is a continuation of U.S. application Ser. No. 08/146,840, filed Oct. 29, 1993, now abandoned.

FIELD OF THE INVENTION

This invention relates generally to an image sensor, and more particularly to an apparatus which is able to capture a high resolution image with a lower resolution full frame CCD image sensor with integrated apertures.

BACKGROUND OF THE INVENTION

A charge-coupled device (CCD), also generally known as a charge transfer device, is a dynamic device which moves charge along a predetermined path under the control of clock pulses. Charge-coupled devices are used in a variety of different types of devices and applications, such as signal processing, memories and imaging. Basically, there are two types of area CCDs, interline CCDs and full frame CCDs.

In imaging applications, interline CCDs are used primarily in image sensors used for capturing movie or video-type images. With these image sensors, a plurality of photosensors are each coupled to an interline CCD. A shield covers the interline CCD and most of the image sensor except for the photosensors. Typically, the photosensors only occupy about twenty to twenty-five percent of the surface area of the image sensor exposed to the image. Accordingly, when an image is exposed to the image sensor, a substantial portion of the image is lost to areas of the image sensor which are not photosensitive.

The advantage of interline CCD image sensors is the separation of the photocollection function from the charge transfer function. This separation allows each photosensor to form charge packets in proportion to the intensity of light exposed to the particular photosensor which can be quickly shifted out to the interline CCD for transfer allowing the photosensors to begin storing charge packets for the next image. Thus, images can be captured and transferred out in a rapid sequence, making interline CCD image sensors particularly useful for imaging apparatus for making movies or videos.

In other imaging applications, such as still photography, full frame CCD image sensors are used. In full frame CCD image sensors, the CCDs include a photosensitive layer which covers all or virtually all of the surface area which is to be exposed to the image to be captured. Accordingly, with full frame CCD image sensors, all or virtually all of an image exposed to the sensor can be scanned or captured. Unlike interline CCD image sensors, the photocollection function is not separated from the charge transfer function in these sensors. Therefore, once the image has been captured by the full frame CCD image sensor, the photosensors must be shielded until the full frame CCDs can shift out the stored charge packets for processing. Any exposure of the photosensors to light during the transfer process will result in additional charge being stored in the charge packets as they are being shifted out. This additional charge will smear the resulting image. Thus, full frame CCD image sensors are able to capture more of the image, than interline CCD image sensors, but do not operate as quickly because they must perform the photocollection and charge transfer functions in sequence.

One of the major problems with interline CCD imager sensors is the loss of a portion of the image because of the particular architecture of the sensor. To overcome this problem the process of dithering was developed. With dithering the image is scanned and then either the image or the photosensitive areas of the interline CCD image sensor are shifted so that the image sensor can scan or capture another portion of the image. To obtain a higher resolution image, several scans of the image are generally needed. Heretofore, the dithering process has not been used with full-frame CCD image sensors because these sensors are already able to capture all or virtually all of the image. Thus, there would be no need to employ the dithering process.

A problem with full frame CCD imaging sensors has been the trade-off between capturing the full resolution of an image and the cost of a full frame CCD image sensor which can perform one-to-one imaging. For example, a film negative typically consists of an image which is 3,000×2,000 pixels. To avoid losing any resolution of the image, an image sensor which has 3,000×2000 pixels would be needed. Unfortunately, the cost of such an image sensor to perform one-to-one imaging is prohibitively expensive. If an image sensor which had 1,500×1,000 pixels was used, the cost of the apparatus would be reduced making the apparatus more commercially marketable, however there would be a significant loss of resolution in any image captured because one pixel of the image sensor would capture or scan four pixels of the image on the film negative.

PROBLEM(S) TO BE SOLVED BY THE INVENTION

To increase the resolution captured by a full frame CCD image sensor without making the image sensor prohibitively expensive, when the image has a higher resolution then the image sensor.

SUMMARY OF THE INVENTION

Accordingly, it is a general object of this invention to provide an improved full frame CCD image sensor.

It is another object of the invention, to improve the resolution of images obtained with a full frame CCD image sensor without performing one-to-one imaging.

It is to another object of the invention, to decrease the cost of a full frame CCD image sensor without losing resolution quality.

According to the present invention, these and other objects and advantages are achieved in an apparatus for scanning an image which includes an image sensor with full frame charge coupled devices with a photosensitive surface area and a mask covering a portion of the photosensitive layer. The mask includes a plurality of apertures which expose portions of this photosensitive layer. The apparatus also includes an exposure controller for controlling the exposure of the photosensitive layer to the image to be scanned and also a shifter for shifting either the image or the full frame charge coupled device to expose a different portion of the image to the exposed photosensitive areas in the apertures.

ADVANTAGEOUS EFFECT(S) OF THE INVENTION

With the present invention, the resolution obtained from a full frame CCD image sensor is improved without requiring an image sensor which can provide one-to-one imaging.

The present invention is also able to reduce the cost of an apparatus with a full frame CCD image sensor, without decreasing resolution.

DETAILED DESCRIPTION OF THE INVENTION

Figure 1:
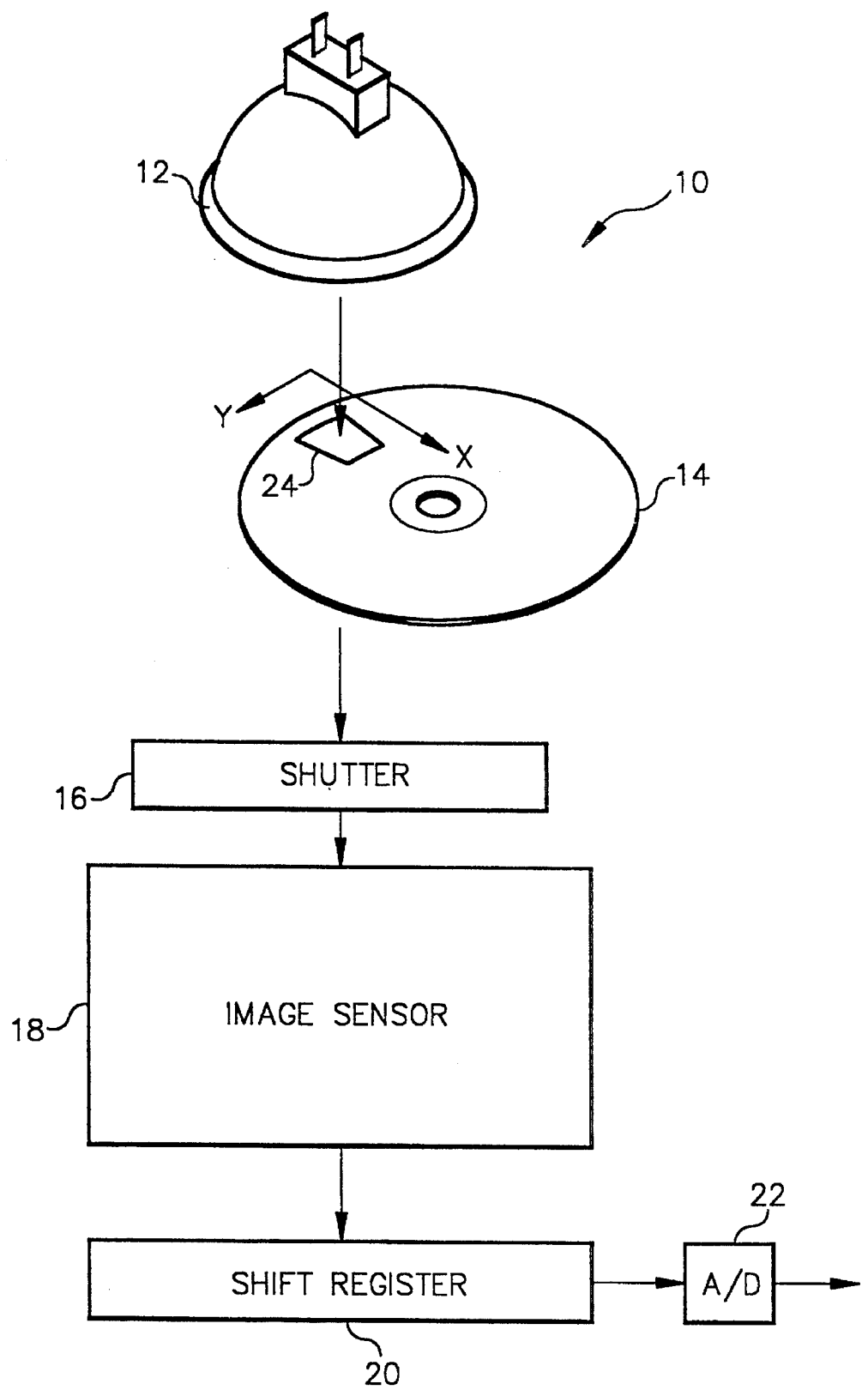
FIG. 1 is a block diagram of an apparatus for scanning an image with a full frame CCD image sensor in accordance with the invention.

An apparatus 10 for scanning an image in accordance with one embodiment of the present invention is shown in FIG. 1. The apparatus 10 includes a light source 12, a disc 14, a shutter 16, an image sensor 18, a horizontal shift register 20 and an analog-to-digital (A/D) converter 22. With the apparatus 10, high resolution images can be captured with a lower resolution full frame CCD image sensor 18, without losing resolution of the image. The use of a lower resolution full frame CCD image sensor 18 helps to reduce the cost of the apparatus 10 making the apparatus 10 more commercially marketable.

The invention is disclosed as being embodied preferably in an image sensing apparatus 10 used in still photography applications. Because the features of an image sensing apparatus 10 are generally known, the description which follows is directed in particular only to those elements forming part of or cooperating directly with the disclosed embodiment. It is to be understood, however, that other elements may take various forms known to a person of ordinary skill in the art.

Referring more specifically to FIG. 1, an image sensing apparatus 10 in accordance with one embodiment of the invention is shown. In this embodiment, the light source 12 is a lamp which is mounted over a disc 14 which houses a film negative 24. The light source 12 may be any type of continuous light source, such as a 600-watt tungsten lamp, or any type of in-continuous light source, such as a strobe light. The apparatus 10 may include an optional shutter 16 which is installed between the film negative 24 and the image sensor 18 or alternatively between the light source 12 and the disc 14. The image sensor 18 is located between the optional shutter 16 and the horizontal shift register 20. The horizontal shift register 20 is coupled to the image sensor 18 and also to an analog-to-digital (A/D) converter 22. The A/D converter 22 is coupled to processing circuitry which is not shown.

Figure 2A:
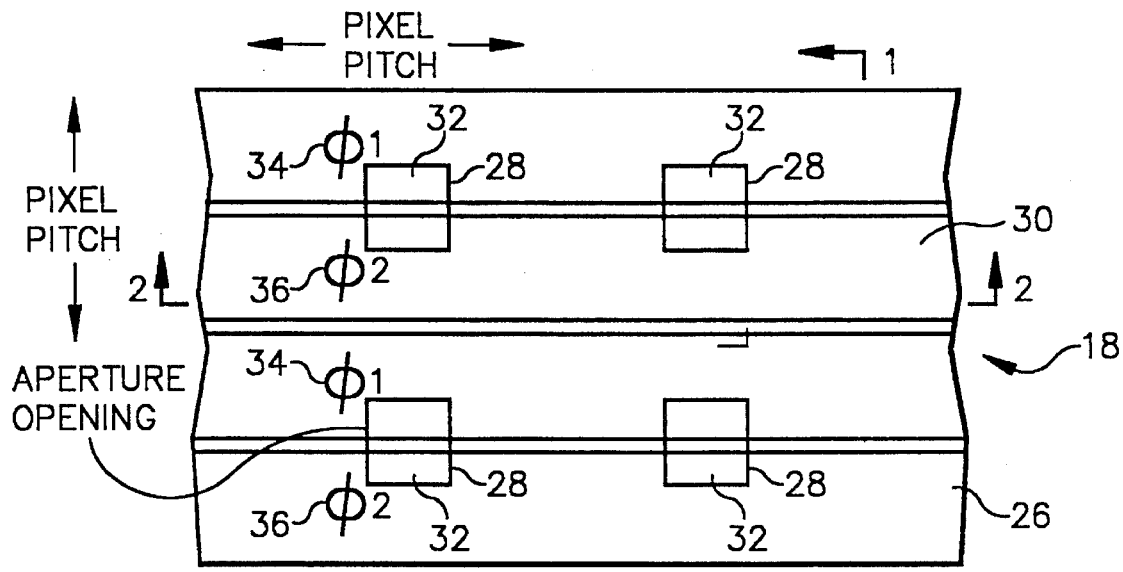
FIG. 2(a) is a fragmentary top view of the full frame CCD image sensor with the integrated apertures.
Figure 2B:
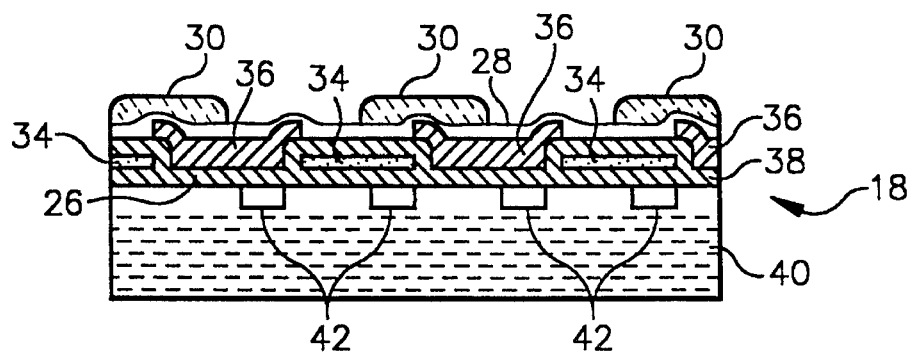
FIG. 2(b) is a view taken along line 1-1 of the fragmentary view of the full frame CCD image sensor.
Figure 2C:
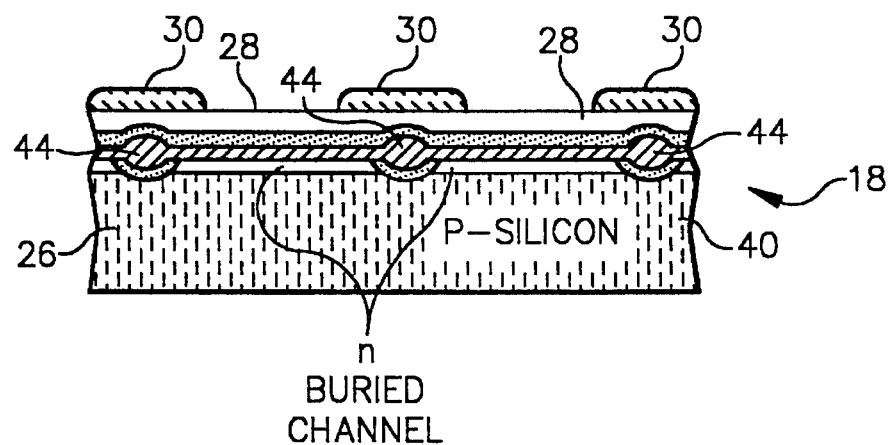
FIG. 2(c) is a view taken along line 2-2 of the fragmentary view of the full frame CCD image sensor.

The image sensor 18 is shown more clearly in FIGS. 2(a-c) and includes full frame charge coupled devices (CCDs) 26 covered with a photosensitive layer 28 and a mask 30 with integrated apertures 32. The mask 30 is formed on the photosensitive layer 28. FIG. 2(a) shows a top fragmentary view of the full frame CCD image sensor 18 which illustrates the photosensitive layer 28, the first and second electrodes gates 34 and 36 and the mask 30 with the apertures 32. FIG. 2(b) shows a fragmentary view of the full frame CCD image sensor 18 taken along line 1-1 of FIG. 2(a). This fragmentary view helps to illustrate the two-phase CCD which is used in this embodiment. In this view, the top layer is the mask 30 followed by the photosensitive layer 28. Next are the first and second electrode gates 34 and 36 in a layer of silicon dioxide 38. Below the gates 34 and 36 is a layer of P-type silicon 40 with ion implant donors 42 which help to shift the charge packets. Although a two-phase CCD is shown, other types of CCDs could be used, such as a three-phase CCD. FIG. 2(c) illustrates a view taken along line 2-2 of FIG. 2(a) and illustrates another view of the image sensor 18 and in particular the channel stops 44. The channel stops 44 prevent the shifting of charges between the wells in adjacent full frame CCDs 26.

When the imaging apparatus 10 shown in FIG. 1 is operational, the light source 12 is turned on to illuminate an image on the film negative 24. The illuminated image strikes the photosensitive layer 28 on the image sensor 18. Either a strobe lamp or a shutter 16 is used to control the length of the exposure of the image on the photosensitive layers 28. With the strobe light, the image is only illuminated on to the photosensitive layer 28 while the strobe flashes on and with the shutter 16, the image is only illuminated on to the photosensitive layer 28 when the shutter 16 is open. The timing of the strobe and of the shutter 16 are controlled by respective controllers which are not shown.

The operation of the full frame CCD image sensor 18 can be explained with reference to FIGS. 2(a-c), particularly with reference to FIG. 2(b). As briefly discussed previously, the exposed photosensitive layer 28 in the apertures 32 in the mask 30 forms charge packets proportional to the intensity of the light at the particular exposed area. The charge packets are stored in wells in the full frame CCDs 26 adjacent to the exposed photosensitive areas. While the charge packets are being formed, the first and second electrode gates 34 and 36 are turned off. When charge packets are no longer being formed, first electrode gate 34 is pulsed positively, the charge packets in the wells are transferred to the deepest wells under the first electrode gate 34 and then both electrode gates 34 and 36 are turned off. When second electrode gate 36 is now pulsed positively, the charge packets move to the implanted regions under the second electrode gate 36. Typically, a clock signal is used to control the pulsing of both electrode gates 34 and 36. This process is continued until all of the stored charge packets have been transferred out to the horizontal shift register 20, then to the A/D converter 22 and then out for processing. Once the charge packets have been shifted out, then the photosensitive layer 28 can be exposed to form new charge packets.

Figure 3:
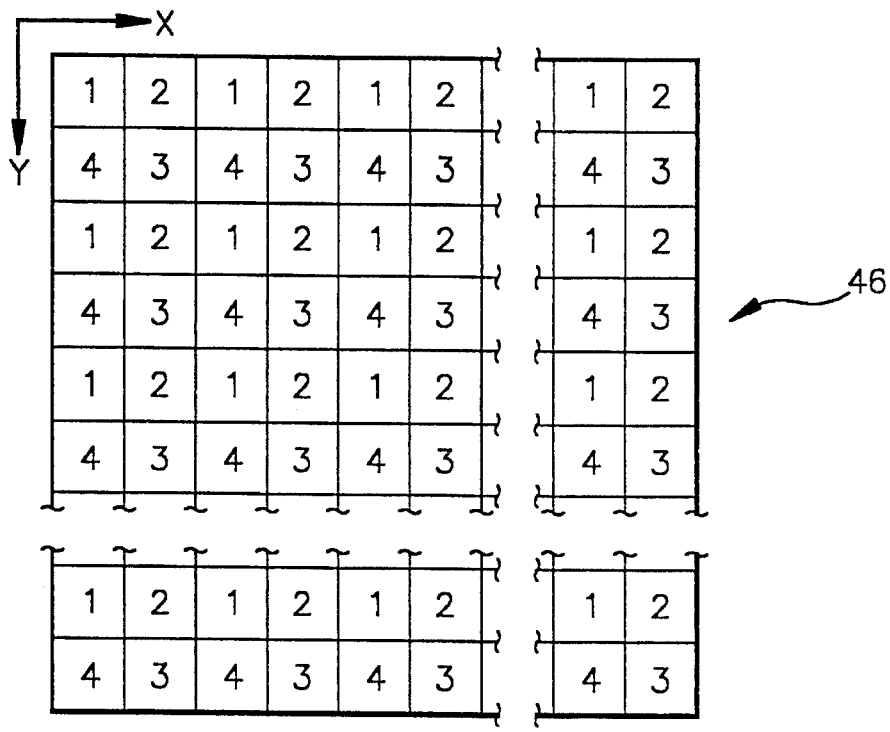
FIG. 3 is illustrates a pattern for an image to be sampled by the apparatus.

FIG. 3 illustrates one example of a pattern 46 of an image which can be illuminated on to the full frame CCD image sensor 18. Although one particular image pattern 46 is illustrated, it would be obvious that other images patterns could have been used. In this particular example, the image pattern 46 represents a typical picture which has a resolution of approximately 3,000×2,000 pixels. The pixels have been marked in groups of four shown by the numerals 1–4 for reasons which will be discussed later. It would be obvious to one skilled in the art to establish other groupings.

Figure 4:
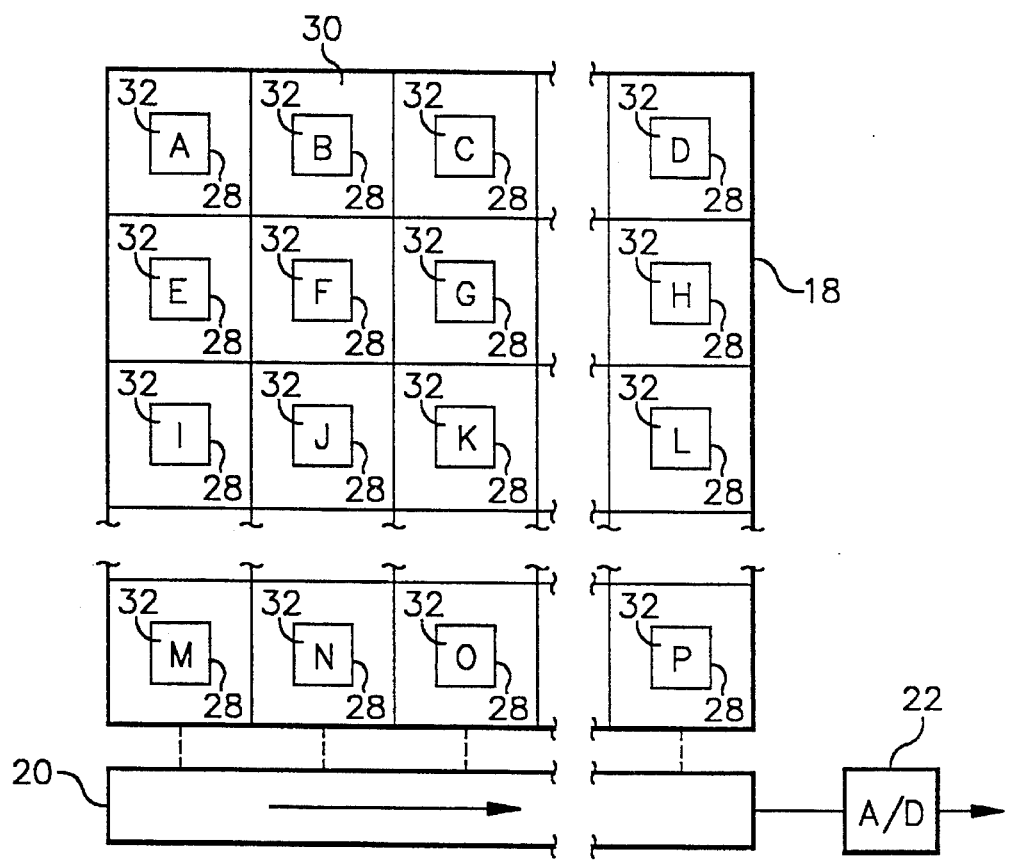
FIG. 4 is a top view of the full frame CCD image sensor with integrated apertures.

In FIG. 4, a diagram of a full frame CCD image sensor 18 with the photosensitive layer 28 and the mask 30 with integrated apertures 32 is shown. The integrated apertures are labelled as A–P in FIG. 4. As noted in the background, the photosensitive layer 28 in a full frame CCD image sensor 18 occupies all or virtually all of the surface area exposed to the image. In accordance with the invention, a mask 30 with integrated apertures 32 is formed over the photosensitive layer 28. The mask 30 is made from some type of opaque or other nontransparent material, preferably a material like aluminum. Preferably, the size of each aperture 32 corresponds to one pixel of the image, although other ratios could be used without departing from the spirit or scope of the invention. The particular number and size of the apertures 32 can vary as desired and as needed. In this embodiment, the apertures 32 are left open, although the apertures 32 could be partially or completely filled with some type of transparent material.

With an image with approximately 3000×2000 pixels, such as the one illustrated by the image pattern 46 shown in FIG. 3, one-to-one imaging with a full frame CCD image sensor with approximately 1500×1000 pixels, such as the one shown illustrated in FIG. 4, would not be possible because four pixels of the image would be sensed by one pixel of the image sensor. As a result, there would be a significant loss of resolution. Replacing the lower resolution image sensor with a higher resolution image sensor with 3000×2000 pixels would allow for one-to-one imaging, but as noted in the background using such a sensor would make the imaging apparatus prohibitively expensive and thus unmarketable.

With the present invention, the full resolution of the image shown in FIG. 3, which has approximately 3000×2000 pixels, can be scanned or captured by a lower resolution and thus less expensive image sensor, such as the image sensor 18 shown in FIG. 4 which has approximately 1500×1000 pixels. As discussed previously, the image sensor 18 includes a mask 30 with a plurality integrated apertures 32 which are labelled A–P in this example. In this particular embodiment, the photosensitive layer 28 beneath the apertures A–P in the image sensor 18 would each first scan all of the pixels with a number 1 on the image pattern 46 shown in FIG. 3. The photosensitive layer 28 would form charge packets proportional to the intensity of the light detected and store the charge packets in the full frame CCDs 26 beneath the photosensitive layer 28. Once the charge packets have been accumulated for all of the pixels with a number 1, the light source 12 is turned or "strobed off" or the shutter 16 is closed and the stored charge packets are shifted out by the full frame CCDs 26 to the horizontal shift register 20. Once the charge packets have been completely shifted out, the image pattern 46 or the image sensor 18 is shifted so that apertures A–P are now situated over all of the pixels with a number 2 on the image shown in FIG. 2 and the above described process is repeated. An apparatus to move the image is disclosed in U.S. Pat. No. 4,638,371 to Milch and is incorporated herein by reference and an apparatus to move the CCD image sensor is disclosed in U.S. Pat. No. 4,755,876 to Dangler and is also incorporated by reference herein. The process is also then repeated for pixels with a number 3 and then with a number 4 shown in FIG. 3. In this particular embodiment, four passes are needed to scan the entire image. When the scanning is complete, the full resolution has been captured by the lower resolution full frame CCD image sensor 18, without the need for a more costly higher resolution image sensor.

The particular size of the apertures 32 and/or the amount of shifting can obviously vary. For example, scenarios for 2×2, 2×3, 3×3, 3×4, 4×4, etc. imaging could be established. Additionally, shifting the image or image sensor 18 to obtain one-to-one resolution is not necessary. For example in the particular embodiment described above, the process could have been stopped after reading only pixels with the numbers 1 and 2. Although one-to one imaging would not be obtained, the resolution of the scanned image would still be improved. Other such variations would be obvious to one skilled in the art.

The invention has been described with reference to a preferred embodiment. However, it will be appreciated that variations and modifications can be effected by a person of ordinary skill in the art without departing from the scope of the invention.

| PARTS LIST | |
|---|---|
| 10 | apparatus |
| 12 | light source |
| 14 | disc |
| 16 | shutter |
| 18 | image sensor |
| 20 | horizontal shift register |
| 22 | A/D converter |
| 24 | film negative |
| 26 | full frame CCD |
| 28 | photosensitive layer |
| 30 | mask |
| 32 | aperture |
| 34 | first electrode gate |
| 36 | second electrode gate |
| 38 | silicon dioxide |
| 40 | P-type silicon |
| 42 | ion implant donors |
| 44 | channel stops |
| 46 | pattern |

What is claimed is:

1. An image sensor for scanning an image when the image sensor has a lower resolution than the image, the image sensor comprising:

at least one full frame charge coupled device with a photosensitive layer, said photosensitive comprising a plurality of discrete pixels; and a mask covering said photosensitive layer, said mask has a plurality of apertures arranged such that there is one of said apertures that corresponds to one of said discrete pixels, each of said plurality of apertures in said mask being of a size that is less than the size of its corresponding to said one discrete pixel of the image sensor;

said exposed portions of said photosensitive layer forming charge packets proportional to the intensity of light exposed to said exposed portions of said photosensitive layer and storing the charge packets in said full frame charge coupled device;

first means for exposing only a portion of each of said discrete pixels, said portion being proportional to said aperture size, and second means for changing relative position of said apertures and their corresponding said discrete pixels to illuminate a different portion of each of said discrete pixels.

2. The image sensor as set forth in claim 1 wherein the size of each said apertures in said mask substantially corresponds to the size of one pixel of the image to be scanned.

3. An apparatus for capturing an image comprising:

an image sensor, said image sensor comprising:

at least one full frame charge coupled device with a photosensitive layer, said photosensitive layer being divided into a matrix of pixels; and a mask covering a portion of said photosensitive layer, said mask has a plurality of apertures arranged such that there is essentially one of said apertures for each of said pixels, and each of said apertures creating an exposed portion of its respective said pixel and the size of each of said plurality of apertures being less than its respective pixel;

said exposed portions created by the apertures of said photosensitive layer forming charge packets proportional to the intensity of light exposed to said exposed portions of said photosensitive layer in said full frame charge coupled device;

means for controlling the exposure of said exposed portions of said pixels to the image; and means for relatively adjusting exposed portions of said pixels to expose a different portion of each of said pixels to the image by adjusting the exposure each of said apertures over each of said respective pixels.

4. The apparatus as set forth in claim 3 wherein the number of movements by said relatively adjusting means for moving a predetermined number which is inversely proportional to the percentage of the number of pixels in the image to be captured.

5. The apparatus as set forth in claim 4 wherein the size of each said apertures in said mask substantially corresponds to the size of one pixel of the image to be scanned and including a means for shifting which substantially shifts each pixel of the image over one of said apertures.

6. The apparatus as set forth in claim 5 wherein said means for shifting comprises a piezoelectric transducer system for shifting said image sensor to successive positions to allow each pixel of the image to be scanned.

7. The apparatus as set forth in claim 5 including a shift register wherein said means for shifting shifts the charge packets from the full frame charged coupled device to the shift register.

8. The apparatus as set forth in claim 6 wherein said means for controlling the exposure comprises a shutter.

9. The apparatus as set forth in claim 6 wherein said means for controlling the exposure comprises a strobe light.

* * * * *